United States Patent
Petroski (12)

(10) Patent No.: US 6,481,874 B2
(45) Date of Patent: Nov. 19, 2002

(54) HEAT DISSIPATION SYSTEM FOR HIGH POWER LED LIGHTING SYSTEM

(75) Inventor: James T. Petroski, Parma, OH (US)

(73) Assignee: GELcore LLC, Valley City, OH (US)

( * ) Notice: Subject to any disclaimer, the term of this patent is extended or adjusted under 35 U.S.C. 154(b) by 0 days.

(21) Appl. No.: 09/681,400

(22) Filed: Mar. 29, 2001

(65) Prior Publication Data

US 2002/0141197 A1 Oct. 3, 2002

(51) Int. Cl.[7] .......................... F21V 29/00; H01L 23/36
(52) U.S. Cl. ...................... 362/373; 362/800; 257/706; 257/720
(58) Field of Search .................. 362/294, 373, 362/545, 555, 800; 257/705, 706, 707, 720

(56) References Cited

U.S. PATENT DOCUMENTS

| 4,901,324 | A | | 2/1990 | Martin ........................ 372/36 |
| 5,291,040 | A | | 3/1994 | Oppermann et al. ......... 257/133 |
| 5,632,551 | A | * | 5/1997 | Roney et al. ................ 362/294 |
| 5,898,211 | A | | 4/1999 | Marshall et al. ............. 257/601 |
| 6,045,240 | A | | 4/2000 | Hochstein .................... 362/294 |
| 6,318,886 | B1 | * | 11/2001 | Stopa et al. .................. 362/800 |
| 2001/0007527 | A1 | * | 7/2001 | Lammers et al. ........... 362/294 |
| 2001/0030866 | A1 | * | 10/2001 | Hochstein .................... 362/294 |
| 2001/0035577 | A1 | * | 11/2001 | Akram ........................ 257/706 |

FOREIGN PATENT DOCUMENTS

JP 402114658 A * 4/1990 ................. 257/706

* cited by examiner

Primary Examiner—Alan Cariaso
(74) Attorney, Agent, or Firm—Fay, Sharpe, Fagan, Minnich & McKee, LLP

(57) ABSTRACT

A high power LED lamp device includes a high power LED, a die for supplying electrical power to the LED, a heat sink secured to the die, and a housing between the heat sink and an external environment. Heat within the die is conducted to the heat sink. The housing conducts the heat received from the heat sink to the external environment.

22 Claims, 2 Drawing Sheets

HEAT DISSIPATION SYSTEM FOR HIGH POWER LED LIGHTING SYSTEM

BACKGROUND OF THE INVENTION

The present invention relates to light emitting diode systems. It finds particular application in conjunction with the dissipation of heat in light emitting diode systems and will be described with particular reference thereto. It will be appreciated, however, that the invention is also amenable to other like applications.

Standard filament bulb flashlight systems dissipate heat by radiating a large percentage of heat to the front lens and a smaller amount to the interior of the flashlight. The heat radiated to the front of the lens is dissipated to the environment. Such conventional heat dissipation systems are suitable for standard filament bulb systems and conventional low power light emitting diode ("LED") flashlight systems. In other words, current low power LED flashlights have not required a special heat dissipation design.

Relatively high power LED lighting systems have recently become available. These higher power LED lighting systems (e.g., flashlights) dissipate heat by a different heat transfer path than ordinary filament bulb systems. More specifically, these higher power LED lighting systems dissipate a substantial amount of heat via a cathode (negative terminal) leg or through a die attached in a direct die mount device. Therefore, the conventional heat dissipation systems do not adequately reduce heat in higher power LED systems (e.g., flashlights). Consequently, the higher power LED systems tend to run at higher operating temperatures.

Higher operating temperatures degrade the performance of the high power LED lighting systems. Experiments with a wide variety of LEDs have suggested an exponential relationship of the life expectancy of an LED versus operating temperature. The well known Arhenius function is an approximate model for LED degradation: D varies according to $te^{kT}$, where D is the degradation, t is time, e the base of natural logarithms, k an activation constant, and T the absolute temperature in degrees Kelvin. While this formulation is necessarily inexact, and is clearly device dependent, within a given LED family, the empirical data can be modeled satisfactorily. The impact of this realization is dramatic. While room temperature (25° C.) lifetimes may in fact approach one hundred thousand hours, operation at close to 90° C. may reduce an LED life to less than seven thousand hours.

Because no effective means has been available for passively cooling an LED die in higher power LED lighting systems, the operating life of LEDs used in higher power lighting applications has been shortened.

The present invention provides a new and improved apparatus and method which overcomes the above-referenced problems and others.

BRIEF SUMMARY OF THE INVENTION

A heat dissipating system for an LED lighting device includes an LED, a die for supplying electrical power to the LED, a thermally conductive material secured to the die, and an outer body around the thermally conductive material. Heat within the die is conducted to the thermally conductive material. The heat is transferred from the thermally conductive material to an external environment via the outer body.

In accordance with one aspect of the invention, a die support is between the die and the thermally conductive material. The heat within the die is transferred to the thermally conductive material via the die support.

In accordance with another aspect of the invention, the thermally conductive material includes a metal material.

In accordance with a more limited aspect of the invention, the thermally conductive material is a one-piece casing of the metal material.

In accordance with another aspect of the invention, the thermally conductive material is a sleeve assembly.

In accordance with another aspect of the invention, a circuit board is secured to the conductive material.

In accordance with another aspect of the invention, the heat is transferred from the thermally conductive material to the outer body via conduction.

In accordance with a more limited aspect of the invention, the heat is transferred from outer body to the external environment via convection.

In accordance with another aspect of the invention, the heat is transferred from the thermally conductive material to the outer body via a contact between the conductive material and the outer body.

In accordance with another aspect of the invention, a thermally conductive adhesive between the conductive material and the outer body transfers the heat from the thermally conductive material to the outer body.

One advantage of the present invention is that it provides a highly efficient heat dissipating design for higher power LED lighting systems.

Another advantage of the present invention is that it provides a longer lifetime for LED lighting systems.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE INVENTION

Figure 1:
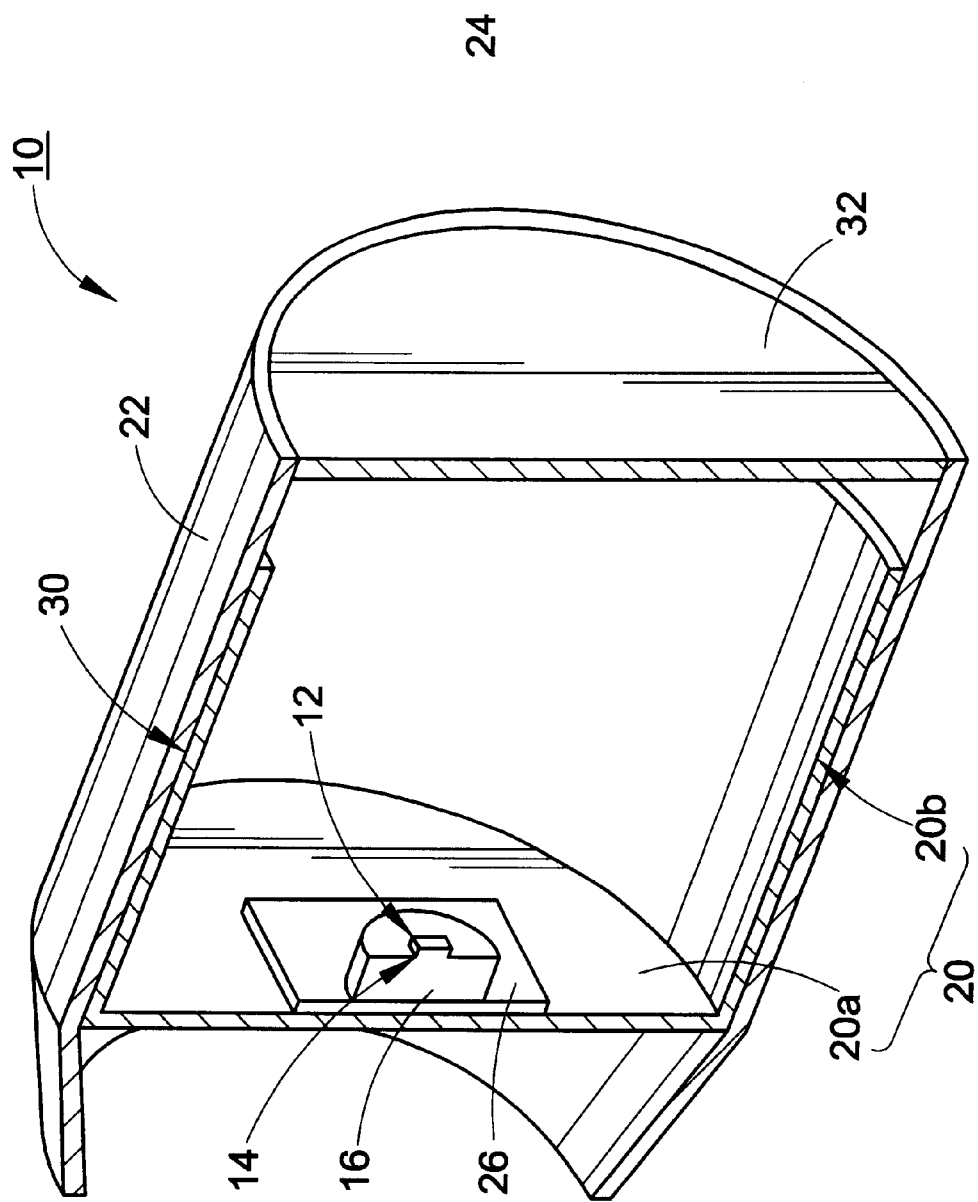
FIG. 1 illustrates a cross-sectional view of a high power LED lamp device having a heat dissipation system according to a first embodiment of the present invention.

With reference to FIG. 1, an LED lighting device 10 includes a light emitting diode ("LED") 12 mechanically secured within a die 14. In the preferred embodiment, the LED 12 is a high powered LED (e.g., an LED having an input power greater than or equal to about 0.25 Watts).

The die 14 receives electrical power from a power source (not shown) and supplies the power to the LED 12. In the preferred embodiment, the power source is a battery (e.g., a d.c. battery); however, it is to be understood that other power sources (e.g., a.c. or d.c. electric power) are also contemplated. A first side of a die support (die attachment) 16 is secured to the die 14. A thermally conductive material 20, which acts as a heat sink, is secured to a second side of the die support 16. Heat within the die 14 is transferred to the heat sink 20 via the die support 16. An outer body (housing) 22 is secured around the thermally conductive material 20. The heat is transferred from the thermally conductive material 20 to an external environment 24 via the outer body 22. In the preferred embodiment, the heat from the die 14 is primarily transferred to the heat sink 20 and then to the outer body 22 via conduction, rather than radiation or convection. Furthermore, the heat is preferably transferred from the outer body 22 to the external environment 24 via convection.

As is customary, the die 14 and the die support 16 include materials such as GaN, silver-filled epoxy and/or metallic lead frame assemblies.

Optionally, a printed circuit board ("PCB") 26, with or without a thermal plane, is secured to the thermally conductive material 20. The PCB controls power supplied to the LED 12 and helps conduct the heat away from the die 14.

In the preferred embodiment, the heat sink 20 includes a metal material (e.g., copper or aluminum). However, other thermally conductive materials (e.g., magnesium and/or copper alloys (brasses)) are also contemplated. For example, in the preferred embodiment, the heat sink 20 is cast as a one-piece casing of the metal material. Additionally, the heat sink 20 includes first and second portions 20a, 20b, respectively, which form a sleeve assembly. More specifically, the first portion 20a of the sleeve assembly is disk shaped while the second portion 20b is substantially cylindrically shaped and extends in a direction to surround the LED 12, the die 14, and the die support 16. The diameters of the first and second portions 20a, 20b of the heat sink 20 are less than the diameter of the outer body 22. Preferably, the outer body 22 substantially surrounds the heat sink 20.

A thermally conductive adhesive 30 (e.g., a metal-filled epoxy) secures the outer body 22 to the thermally conductive material 20. Therefore, the heat from the heat sink 20 is conducted to the outer body 22 via the thermally conductive adhesive 30. In another embodiment, an intimate fit of the heat sink 20 to the outer body 22 is substituted for the thermally conductive adhesive 30. Such an intimate fit is accomplished by various means (e.g., interference fit or overmolding).

A lens 32 for protecting the LED 12, the LED die 14, and the die support 16 and for focussing the light produced by the LED 12 is secured near one end of the outer housing 22. Preferably, the lens 32 is substantially disk shaped and has a diameter slightly less than the outer housing 22, thereby permitting the lens to be frictionally secured within the outer housing 22. The lens may also be secured by other chemical/mechanical methods, such as (but not limited to) adhesives, ultrasonic welding, snap fits or vibration welding.

The LED lighting device 10 is manufactured by securing the high power LED 12 to the die 14. The die 14 and the thermally conductive material 20 are mounted to the die support 16. In this manner, heat within the die 14 is conducted to and distributed across the thermally conductive material 20. The housing 22 is secured between the thermally conductive material 20 and the external environment 24. The adhesive 30 is optionally applied to one of the housing 22 and the thermally conductive material 20. Then, the thermally conductive material 20 is frictionally secured within the housing 22. The adhesive 30, if applied, further secures the thermally conductive material 20 and the housing 22.

Figure 2:
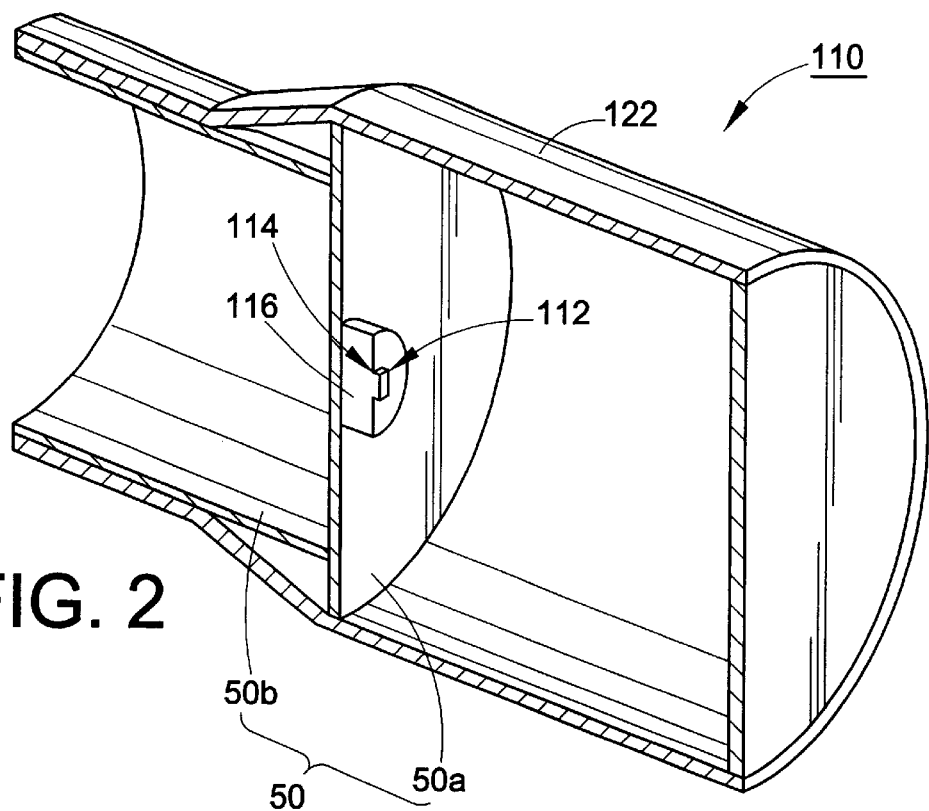
FIG. 2 illustrates a cross-sectional view of a high power LED lamp device having a heat dissipation system according to a second embodiment of the present invention.

A second embodiment of the present invention is illustrated in FIG. 2. For convenience, components of the embodiment illustrated in FIG. 2, which correspond to the respective components of the embodiment illustrated in FIG. 1, are given numerical references greater by one-hundred than the corresponding components in FIG. 1. New components are designated by new numerals.

With reference to FIG. 2, a heat sink 50 is a sleeve assembly that includes first and second portions 50a, 50b, respectively. As in the preferred embodiment, the first portion 50a of the sleeve assembly is disk shaped while the second portion 50b is substantially cylindrically shaped. However, in the second embodiment, the second portion 50b of the heat sink 50 extends in a direction away from the LED 112, the die 114, and the die support 116. Furthermore, the diameters of the first and second portions 50a, 50b of the heat sink 50 are less than the diameter of the outer body 122, and the outer body 122 substantially surrounds the heat sink 50.

The edges of the heat sink 50 shown in FIG. 2 directly contact the outer body (housing) 122, such that the heat sink 50 is frictionally secured within the housing 122. In other words, unlike the LED lighting device 10 shown in FIG. 1, no thermally conductive adhesive is between the heat sink 50 and the housing 122 of the LED lighting device 110 shown in FIG. 2.

Although the embodiment of FIG. 1 includes the adhesive 30 while the embodiment of FIG. 2 does not, it is to be understood that a thermally conductive adhesive may or may not be included in either of the respective embodiments of FIGS. 1 and 2.

Figure 3:
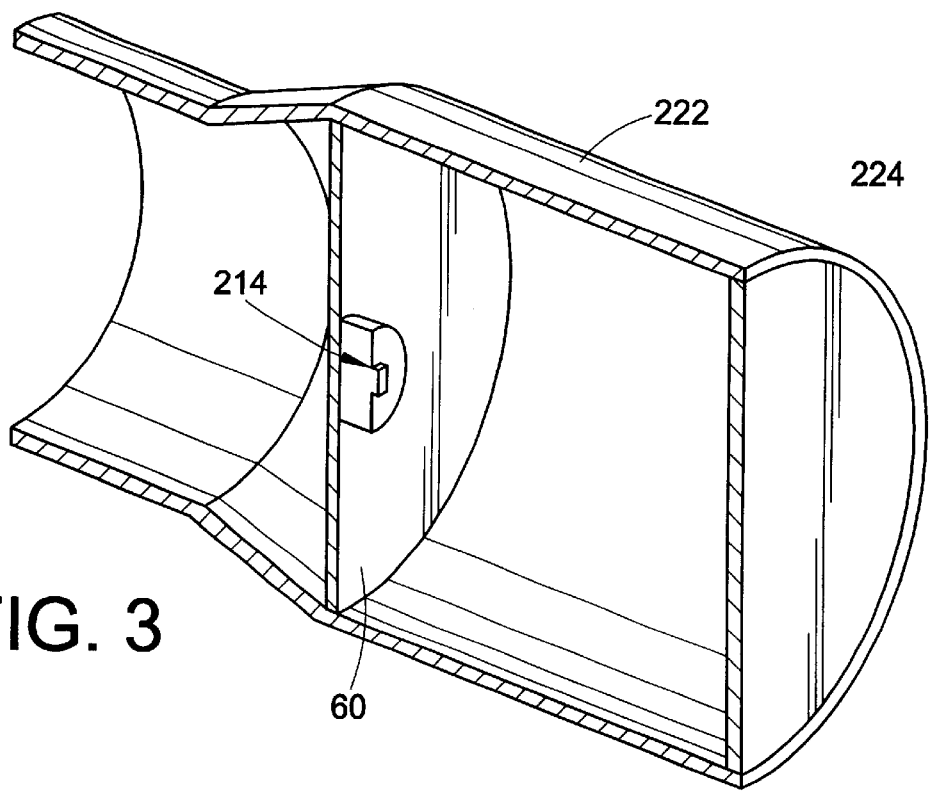
FIG. 3 illustrates a cross-sectional view of a high power LED lamp device having a heat dissipation system according to a third embodiment of the present invention.

A third embodiment of the present invention is illustrated in FIG. 3. For convenience, components of the embodiment illustrated in FIG. 3, which correspond to the respective components of the embodiment illustrated in FIG. 1, are given numerical references greater by two-hundred than the corresponding components in FIG. 1. New components are designated by new numerals.

With reference to FIG. 3, a heat sink 60 is disk shaped. The diameter of the heat sink 60 is less than the diameter of the outer body 222. Furthermore, the outer body 222 substantially surrounds the heat sink 60. In this embodiment, heat from the die 214 is conducted to and distributed across the heat sink 60. Heat reaching the edges of the heat sink 60 is transferred (e.g., conducted) to the outer body (housing) 222. The heat is then transferred (e.g., radiated) from the outer body (housing) 222 to the external environment 224.

The heat dissipating system of the present invention is contemplated to be incorporated into one of a variety of LED lighting devices (e.g., flashlights, spot LED lighting modules, etc).

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A heat dissipating system for an LED lighting device, comprising:
    an LED;
    a die for supplying electrical power to the LED;
    a heat sink including a thermally conductive sleeve, the heat sink secured to the die, heat within the die being conducted to the thermally conductive sleeve; and an outer housing surroundingly contacting the thermally conductive sleeve, the heat being transferred from the thermally conductive sleeve to an external environment via the outer housing.

2. The heat dissipating system for an LED lighting device as set forth in claim 1, wherein the heat sink further includes:

a die support portion arranged inside the thermally conductive sleeve and supporting the die, the heat within the die being transferred to the thermally conductive sleeve via the die support portion.

3. The heat dissipating system for an LED lighting device as set forth in claim 1, wherein the thermally conductive sleeve includes a metal material.

4. The heat dissipating system for an LED lighting device as set forth in claim 1, wherein the heat sink is a one-piece casing of a metal material.

5. The heat dissipating system for an LED lighting device as set forth in claim 2, further including:

a circuit board secured to the die support portion.

6. The heat dissipating system for an LED lighting device as set forth in claim 1, wherein the heat is transferred from the thermally conductive sleeve to the outer housing via conduction.

7. The heat dissipating system for an LED lighting device as set forth in claim 6, wherein the heat is transferred from the outer housing to the external environment via convection.

8. The heat dissipating system for an LED lighting device as set forth in claim 1, wherein the heat is transferred from the thermally conductive sleeve to the outer housing via a contact between the sleeve and the outer housing.

9. The heat dissipating system for an LED lighting device as set forth in claim 1, further including:

a thermally conductive adhesive between the thermally conductive sleeve and the outer housing, the heat being transferred from the thermally conductive sleeve to the outer housing via the thermally conductive adhesive.

10. A high power LED lamp device, comprising:

a high power LED;

a die for supplying electrical power to the LED;

a heat sink secured to the die, heat within the die being conducted to the heat sink, the heat sink having a first portion that supports the LED and a second portion that encompasses and connects with the first portion; and a housing between the heat sink and an external environment, the housing secured with the second portion of the heat sink and in thermal contact therewith, the housing conducting the heat received from the heat sink to the external environment.

11. The high power LED lamp device as set forth in claim 10, further including:

a die attachment structure secured to the die and the heat sink, the heat within the die being transferred to the heat sink via the die attachment structure.

12. The high power LED lamp device as set forth in claim 10, wherein the heat sink is substantially surrounded by the housing.

13. The high power LED lamp device as set forth in claim 10, wherein the second portion of the heat sink frictionally secures with the housing.

14. The high power LED lamp device as set forth in claim 10, further including:

an adhesive between the heat sink and the housing, the heat being conducted from the heat sink to the housing via the adhesive.

15. The high power LED lamp device as set forth in claim 10, wherein:

the second portion of the heat sink has a substantially cylindrical shape;

the first portion of the heat sink has a disk shape and connects with an inner surface of the second portion at a disk circumferential surface; and the housing includes a portion having a substantially cylindrical shape, the substantially cylindrically shaped second portion of the heat sink being surrounded by the substantially cylindrically shaped portion of the housing.

16. A method for manufacturing a high power LED lamp device, the method comprising:

casting a heat sink sleeve assembly including a central support portion and a surrounding sleeve portion;

securing a high power LED to the central support portion, heat within the LED being conducted to and distributed across the heat sink sleeve portion; and securing a housing between the heat sink sleeve portion and an external environment, the housing transmitting the heat received from the heat sink sleeve portion to the external environment.

17. The method for manufacturing a high power LED lamp device as set forth in claim 16, wherein the step of securing the LED includes:

mounting a die support between the LED and the central support portion, the heat within the LED being conducted to the central support portion via the die support.

18. The method for manufacturing a high power LED lamp device as set forth in claim 16, wherein the step of securing the housing includes:

securing an adhesive between the housing and the surrounding sleeve portion of the heat sink sleeve assembly, the heat being transferred from the sleeve to the housing via the adhesive.

19. The method for manufacturing a high power LED lamp device as set forth in claim 16, wherein the step of securing the housing includes:

frictionally connecting the housing and the surrounding sleeve portion of the heat sink sleeve assembly, the heat being transferred from the sleeve to the housing via the frictional connection.

20. An LED lighting apparatus comprising:

a thermally conductive heat sink having a base portion and a sleeve portion joined to one another, said sleeve portion including a wall extending from the base portion, the wall forming a perimeter about a hollow region within the wall and having a surface facing outwardly from the hollow region;

a housing connected to the sleeve portion of the heat sink, said housing having an interior surface surroundingly conforming to the outwardly facing surface of the wall of the sleeve portion of the heat sink, and an exterior surface in direct radiative thermal communication with an environment outside of the LED lighting apparatus; and an LED assembly arranged on the base portion of the heat sink, said LED assembly including an LED which is selectively energized to produce light, wherein heat generated by energizing the LED passes conductively through the heat sink to the housing and radiatively passes from the housing to the environment outside the LED lighting apparatus.

21. The apparatus as set forth in claim 20, wherein the base portion is a substantially planar plate and the wall of the sleeve portion extends therefrom substantially perpendicular to the plate.

22. The apparatus as set forth in claim 21, wherein the heat sink is made from a metallic material.

* * * * *